United States Patent
Vinton et al.

(10) Patent No.: US 7,454,331 B2
(45) Date of Patent: Nov. 18, 2008

(54) CONTROLLING LOUDNESS OF SPEECH IN SIGNALS THAT CONTAIN SPEECH AND OTHER TYPES OF AUDIO MATERIAL

(75) Inventors: Mark Stuart Vinton, San Francisco, CA (US); Charles Quito Robinson, San Francisco, CA (US); Kenneth James Gundry, San Francisco, CA (US); Steven Joseph Venezia, Simi Valley, CA (US); Jeffrey Charles Riedmiller, Martinez, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 612 days.

(21) Appl. No.: 10/233,073

(22) Filed: Aug. 30, 2002

(65) Prior Publication Data

US 2004/0044525 A1  Mar. 4, 2004

(51) Int. Cl.
*G10L 19/14* (2006.01)
(52) U.S. Cl. .................................................... 704/225
(58) Field of Classification Search ................. 704/225, 704/201; 381/107, 96, 307, 18
See application file for complete search history.

(56) References Cited

U.S. PATENT DOCUMENTS

| | | | |
|---|---|---|---|
| 4,281,218 A | | 7/1981 | Chuang et al. |
| 4,543,537 A | * | 9/1985 | Kuhn et al. ................. 330/129 |
| 5,097,510 A | | 3/1992 | Graupe |
| 5,457,769 A | | 10/1995 | Valley |
| 5,548,638 A | * | 8/1996 | Yamaguchi et al. .... 379/202.01 |
| 5,649,060 A | * | 7/1997 | Ellozy et al. ................ 704/278 |
| 5,712,954 A | | 1/1998 | Dezonno |
| 5,819,247 A | | 10/1998 | Freund et al. |
| 5,878,391 A | | 3/1999 | Aarts |
| 6,061,647 A | | 5/2000 | Barrett |
| 6,094,489 A | | 7/2000 | Ishige et al. |

(Continued)

FOREIGN PATENT DOCUMENTS

DE    19509149    9/1996

(Continued)

OTHER PUBLICATIONS

WO 00/78093 Vaudrey et al, "Voice to Remaining Audio (VRA) Interactive Hearing Aid and Auxiliary Equipment", Dec. 21, 2000.*

(Continued)

*Primary Examiner*—Michael N. Opsasnick
(74) *Attorney, Agent, or Firm*—David N. Lathrop; Gallagher & Lathrop

(57) ABSTRACT

Mechanisms are known that allow receivers to control loudness of speech in broadcast signals but these mechanisms require an estimate of speech loudness be inserted into the signal. Disclosed techniques provide improved estimates of loudness. According to one implementation, an indication of the loudness of an audio signal containing speech and other types of audio material is obtained by classifying segments of audio information as either speech or non-speech. The loudness of the speech segments is estimated and this estimate is used to derive the indication of loudness. The indication of loudness maybe used to control audio signal levels so that variations in loudness of speech between different programs is reduced. A preferred method for classifying speech segments is described.

35 Claims, 2 Drawing Sheets

U.S. PATENT DOCUMENTS

| | | | |
|---|---|---|---|
| 6,125,343 | A * | 9/2000 | Schuster .................... 704/201 |
| 6,182,033 | B1 | 1/2001 | Accardi et al. |
| 6,233,554 | B1 * | 5/2001 | Heimbigner et al. ........ 704/225 |
| 6,272,360 | B1 | 8/2001 | Yamaguchi et al. |
| 6,275,795 | B1 | 8/2001 | Tzirkel-Hancock |
| 6,298,139 | B1 * | 10/2001 | Poulsen et al. ............. 381/107 |
| 6,311,155 | B1 * | 10/2001 | Vaudrey et al. ............. 704/225 |
| 6,314,396 | B1 * | 11/2001 | Monkowski ................ 704/233 |
| 6,351,731 | B1 * | 2/2002 | Anderson et al. ........... 704/233 |
| 6,353,671 | B1 | 3/2002 | Kandel et al. |
| 6,370,255 | B1 | 4/2002 | Schaub et al. |
| 6,411,927 | B1 | 6/2002 | Morin et al. |
| 6,625,433 | B1 * | 9/2003 | Poirier et al. ............ 455/232.1 |
| 6,772,127 | B2 * | 8/2004 | Saunders et al. ............ 704/500 |
| 6,807,525 | B1 * | 10/2004 | Li et al. ...................... 704/215 |
| 6,823,303 | B1 * | 11/2004 | Su et al. ...................... 704/220 |
| 6,889,186 | B1 * | 5/2005 | Michaelis ................... 704/225 |
| 6,985,594 | B1 * | 1/2006 | Vaudrey et al. ............... 381/96 |
| 7,065,498 | B1 * | 6/2006 | Thomas et al. ............... 705/26 |
| 7,068,723 | B2 * | 6/2006 | Foote et al. ............ 375/240.25 |
| 7,155,385 | B2 * | 12/2006 | Berestesky et al. .......... 704/215 |

FOREIGN PATENT DOCUMENTS

| | | |
|---|---|---|
| DE | 19848491 | 4/2000 |
| EP | 0517233 | 12/1992 |
| EP | 0746116 | 12/1996 |
| EP | 0637011 | 10/1998 |
| WO | 9827543 | 6/1998 |
| WO | WO 0045379 | 8/2000 |
| WO | WO 0078093 | 12/2000 |

OTHER PUBLICATIONS

Juang et al, "Technical Advances in Digital Audio Radio Broadcasting", Proceedings of the IEEE, vol. 90, Issue 8, Aug. 2002, pp. 1303-1333.*

Atkinson, I. A.; et al., "Time Envelope LP Vocoder: A New Coding Technique at Very Low Bit Rates," 4th E 1995, ISSN 1018-4074, pp. 241-244.

Belger, "The Loudness Balance of Audio Broadcast Programs," J. Audio Eng. Soc., vol. 17, No. 3, Jun. 1969, pp. 282-285.

Saunders, "Real-Time Discrimination of Broadcast Speech/Music," Proc. of Int. Conf. on Acoust. Speech and Sig. Proc., 1996, pp. 993-996.

Moore, Glasberg and Baer, "A Model for the Prediction of Thresholds, Loudness and Partial Loudness," J. Audio Eng. Soc., vol. 45, No. 4, Apr. 1997, pp. 224-240.

Bosi, et al., "ISO/IEC MPEG-2 Advanced Audio Coding," J. Audio Eng. Soc., vol. 45, No. 10, Oct. 1997, pp. 789-814.

Scheirer and Slaney, "Construction and Evaluation of a Robust Multifeature Speech/Music Discriminator," Proc. of Int. Conf. on Acoust. Speech and Sig. Proc., 1997, pp. 1331-1334.

Schapire, "A Brief Introduction to Boosting," Proc. of the 16th Int. Joint Conf. on Artifical Intelligence, 1999.

Glasberg and Moore, "A Model of Loudness Applicable to Time-Varying Sounds", J. Audio Eng. Soc., vol. 50, No. 5, May 2002, pp. 331-342.

Guide to the Use of the ATSC Digital Television Standard, Oct. 1995, Sections 1-4 and 6.0-6.6.

ATSC Standard: Digital Audio Compression (AC-3), Revision A, Aug. 2001, Sections 1-4, 6, 7.3, 7.6, 7.7 and 8.

ATSC Standard: Digital Television Standard, Revision B, Aug. 2001, Sections 1-5 and Annex B.

ISO Standard 532:1975 published 1975.

CEI/IEC Standard 60804 published Oct. 2000.

* cited by examiner

CONTROLLING LOUDNESS OF SPEECH IN SIGNALS THAT CONTAIN SPEECH AND OTHER TYPES OF AUDIO MATERIAL

TECHNICAL FIELD

The present invention is related to audio systems and methods that are concerned with the measuring and controlling of the loudness of speech in audio signals that contain speech and other types of audio material.

BACKGROUND ART

While listening to radio or television broadcasts, listeners frequently choose a volume control setting to obtain a satisfactory loudness of speech. The desired volume control setting is influenced by a number of factors such as ambient noise in the listening environment, frequency response of the reproducing system, and personal preference. After choosing the volume control setting, the listener generally desires the loudness of speech to remain relatively constant despite the presence or absence of other program materials such as music or sound effects.

When the program changes or a different channel is selected, the loudness of speech in the new program is often different, which requires changing the volume control setting to restore the desired loudness. Usually only a modest change in the setting, if any, is needed to adjust the loudness of speech in programs delivered by analog broadcasting techniques because most analog broadcasters deliver programs with speech near the maximum allowed level that may be conveyed by the analog broadcasting system. This is generally done by compressing the dynamic range of the audio program material to raise the speech signal level relative to the noise introduced by various components in the broadcast system. Nevertheless, there still are undesirable differences in the loudness of speech for programs received on different channels and for different types of programs received on the same channel such as commercial announcements or "commercials" and the programs they interrupt.

The introduction of digital broadcasting techniques will likely aggravate this problem because digital broadcasters can deliver signals with an adequate signal-to-noise level without compressing dynamic range and without setting the level of speech near the maximum allowed level. As a result, it is very likely there will be much greater differences in the loudness of speech between different programs on the same channel and between programs from different channels. For example, it has been observed that the difference in the level of speech between programs received from analog and digital television channels sometimes exceeds 20 dB.

One way in which this difference in loudness can be reduced is for all digital broadcasters to set the level of speech to a standardized loudness that is well below the maximum level, which would allow enough headroom for wide dynamic range material to avoid the need for compression or limiting. Unfortunately, this solution would require a change in broadcasting practice that is unlikely to happen.

Another solution is provided by the AC-3 audio coding technique adopted for digital television broadcasting in the United States. A digital broadcast that complies with the AC-3 standard conveys metadata along with encoded audio data. The metadata includes control information known as "dialnorm" that can be used to adjust the signal level at the receiver to provide uniform or normalized loudness of speech. In other words, the dialnorm information allows a receiver to do automatically what the listener would have to do otherwise, adjusting volume appropriately for each program or channel.

The listener adjusts the volume control setting to achieve a desired level of speech loudness for a particular program and the receiver uses the dialnorm information to ensure the desired level is maintained despite differences that would otherwise exist between different programs or channels. Additional information describing the use of dialnorm information can be obtained from the Advanced Television Systems Committee (ATSC) A/52A document entitled "Revision A to Digital Audio Compression (AC-3) Standard" published Aug. 20, 2001, and from the ATSC document A/54 entitled "Guide to the Use of the ATSC Digital Television Standard" published Oct. 4, 1995, both of which are incorporated herein by reference in their entirety.

The appropriate value of dialnorm must be available to the part of the coding system that generates the AC-3 compliant encoded signal. The encoding process needs a way to measure or assess the loudness of speech in a particular program to determine the value of dialnorm that can be used to maintain the loudness of speech in the program that emerges from the receiver.

The loudness of speech can be estimated in a variety of ways. Standard IEC 60804 (2000-10) entitled "Integrating-averaging sound level meters" published by the International Electrotechnical Commission (IEC) describes a measurement based on frequency-weighted and time-averaged sound-pressure levels. ISO standard 532:1975 entitled "Method for calculating loudness level" published by the International Organization for Standardization describes methods that obtain a measure of loudness from a combination of power levels calculated for frequency subbands. Examples of psychoacoustic models that may be used to estimate loudness are described in Moore, Glasberg and Baer, "A model for the prediction of thresholds, loudness and partial loudness," J. Audio Eng. Soc., vol. 45, no. 4, April 1997, and in Glasberg and Moore, "A model of loudness applicable to time-varying sounds," J. Audio Eng. Soc., vol. 50, no. 5, May 2002. Each of these references is incorporated herein by reference in its entirety.

Unfortunately, there is no convenient way to apply these and other known techniques. In broadcast applications, for example, the broadcaster is obligated to select an interval of audio material, measure or estimate the loudness of speech in the selected interval, and transfer the measurement to equipment that inserts the dialnorm information into the AC-3 compliant digital data stream. The selected interval should contain representative speech but not contain other types of audio material that would distort the loudness measurement. It is generally not acceptable to measure the overall loudness of an audio program because the program includes other components that are deliberately louder or quieter than speech. It is often desirable for the louder passages of music and sound effects to be significantly louder than the preferred speech level. It is also apparent that it is very undesirable for background sound effects such as wind, distant traffic, or gently flowing water to have the same loudness as speech.

The inventors have recognized that a technique for determining whether an audio signal contains speech can be used in an improved process to establish an appropriate value for the dialnorm information. Any one of a variety of techniques for speech detection can be used. A few techniques are described in the references cited below, which are incorporated herein by reference in their entirety.

U.S. Pat. No. 4,281,218, issued Jul. 28, 1981, describes a technique that classifies a signal as either speech or non-speech by extracting one or more features of the signal such as short-term power. The classification is used to select the appropriate signal processing methodology for speech and non-speech signals.

U.S. Pat. No. 5,097,510, issued Mar. 17, 1992, describes a technique that analyzes variations in the input signal amplitude envelope. Rapidly changing variations are deemed to be speech, which are filtered out of the signal. The residual is classified into one of four classes of noise and the classification is used to select a different type of noise-reduction filtering for the input signal.

U.S. Pat. No. 5,457,769, issued Oct. 10, 1995, describes a technique for detecting speech to operate a voice-operated switch. Speech is detected by identifying signals that have component frequencies separated from one another by about 150 Hz. This condition indicates it is likely the signal conveys formants of speech.

EP patent application publication 0 737 011, published for grant Oct. 14, 1009, and U.S. Pat. No. 5,878,391, issued Mar. 2, 1999, describe a technique that generates a signal representing a probability that an audio signal is a speech signal. The probability is derived by extracting one or more features from the signal such as changes in power ratios between different portions of the spectrum. These references indicate the reliability of the derived probability can be improved if a larger number of features are used for the derivation.

U.S. Pat. No. 6,061,647, issued May 9, 2000, discloses a technique for detecting speech by storing a model of noise without speech, comparing an input signal to the model to decide whether speech is present, and using an auxiliary detector to decide when the input signal can be used to update the noise model.

International patent application publication WO 98/27543, published Jun. 25, 1998, discloses a technique that discerns speech from music by extracting a set of features from an input signal and using one of several classification techniques for each feature. The best set of features and the appropriate classification technique to use for each feature is determined empirically.

The techniques disclosed in these references and all other known speech-detection techniques attempt to detect speech or classify audio signals so that the speech can be processed or manipulated by a method that differs from the method used to process or manipulate non-speech signals.

U.S. Pat. No. 5,819,247, issued Oct. 6, 1998, discloses a technique for constructing a hypothesis to be used in classification devices such as optical character recognition devices. Weak hypotheses are constructed from examples and then evaluated. An iterative process constructs stronger hypotheses for the weakest hypotheses. Speech detection is not mentioned but the inventors have recognized that this technique may be used to improve known speech detection techniques.

DISCLOSURE OF INVENTION

It is an object of the present invention to provide for a control of the loudness of speech in signals that contain speech and other types of audio material.

According to the present invention, a signal is processed by receiving an input signal and obtaining audio information from the input signal that represents an interval of an audio signal, examining the audio information to classify segments of the audio information as being either speech segments or non-speech segments, examining the audio information to obtain an estimated loudness of the speech segments, and providing an indication of the loudness of the interval of the audio signal by generating control information that is more responsive to the estimated loudness of the speech segments than to the loudness of the portions of the audio signal represented by the non-speech segments.

The indication of loudness may be used to control the loudness of the audio signal to reduce variations in the loudness of the speech segments. The loudness of the portions of the audio signal represented by non-speech segments is increased when the loudness of the portions of the audio signal represented by the speech-segments is increased.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. System Overview

Figure 1:
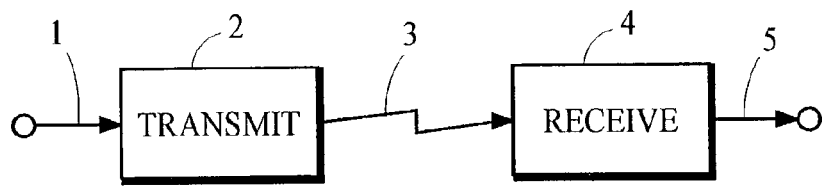
FIG. 1 is a schematic block diagram of an audio system that may incorporate various aspects of the present invention.

FIG. 1 is a schematic block diagram of an audio system in which the transmitter 2 receives an audio signal from the path 1, processes the audio signal to generate audio information representing the audio signal, and transmits the audio information along the path 3. The path 3 may represent a communication path that conveys the audio information for immediate use, or it may represent a signal path coupled to a storage medium that stores the audio information for subsequent retrieval and use. The receiver 4 receives the audio information from the path 3, processes the audio information to generate an audio signal, and transmits the audio signal along the path 5 for presentation to a listener.

The system shown in FIG. 1 includes a single transmitter and receiver; however, the present invention may be used in systems that include multiple transmitters and/or multiple receivers. Various aspects of the present invention may be implemented in only the transmitter 2, in only the receiver 4, or in both the transmitter 2 and the receiver 4.

In one implementation, the transmitter 2 performs processing that encodes the audio signal into encoded audio information that has lower information capacity requirements than the audio signal so that the audio information can be transmitted over channels having a lower bandwidth or stored by media having less space. The decoder 4 performs processing that decodes the encoded audio information into a form that can be used to generate an audio signal that preferably is perceptually similar or identical to the input audio signal. For example, the transmitter 2 and the receiver 4 may encode and decode digital bit streams compliant with the AC-3 coding standard or any of several standards published by the Motion Picture Experts Group (MPEG). The present invention may be applied advantageously in systems that apply encoding and decoding processes; however, these processes are not required to practice the present invention.

Although the present invention may be implemented by analog signal processing techniques, implementation by digital signal processing techniques is usually more convenient. The following examples refer more particularly to digital signal processing.

B. Speech Loudness

The present invention is directed toward controlling the loudness of speech in signals that contain speech and other types of audio material. The entries in Tables I and III represent sound levels for various types of audio material in different programs.

Table I includes information for the relative loudness of speech in three programs like those that may be broadcast to television receivers. In Newscast 1, two people are speaking at different levels. In Newscast 2, a person is speaking at a low level at a location with other sounds that are occasionally louder than the speech. Music is sometimes present at a low level. In Commercial, a person is speaking at a very high level and music is occasionally even louder.

TABLE I

| Newscast 1 | | Newscast 2 | | Commercial | |
|---|---|---|---|---|---|
| Voice 1 | −24 dB | Other Sounds | −33 dB | Music | −17 dB |
| Voice 2 | −27 dB | Voice | −37 dB | Voice | −20 dB |
| | | Music | −38 dB | | |

The present invention allows an audio system to automatically control the loudness of the audio material in the three programs so that variations in the loudness of speech is reduced automatically. The loudness of the audio material in Newscast 1 can also be controlled so that differences between levels of the two voices is reduced. For example, if the desired level for all speech is −24 dB, then the loudness of the audio material shown in Table I could be adjusted to the levels shown in Table II.

TABLE II

| | Newscast 1 | Newscast 2 (+13 dB) | | Commercial (−4 dB) | |
|---|---|---|---|---|---|
| Voice 1 | −24 dB | Other Sounds | −20 dB | Music | −21 dB |
| Voice 2 (+3 dB) | −24 dB | Voice | −24 dB | Voice | −24 dB |
| | | Music | −25 dB | | |

Table III includes information for the relative loudness of different sounds in three different scenes of one or more motion pictures. In Scene 1, people are speaking on the deck of a ship. Background sounds include the lapping of waves and a distant fog horn at levels significantly below the speech level. The scene also includes a blast from the ship's horn, which is substantially louder than the speech. In Scene 2, people are whispering and a clock is ticking in the background. The voices in this scene are not as loud as normal speech and the loudness of the clock ticks is even lower. In Scene 3, people are shouting near a machine that is making an even louder sound. The shouting is louder than normal speech.

TABLE III

| Scene 1 | | Scene 2 | | Scene 3 | |
|---|---|---|---|---|---|
| Ship Whistle | −12 dB | | | Machine | −18 dB |
| Normal Speech | −27 dB | Whispers | −37 dB | Shouting | −20 dB |
| Distant Horn | −33 dB | Clock Tick | −43 dB | | |
| Waves | −40 dB | | | | |

The present invention allows an audio system to automatically control the loudness of the audio material in the three scenes so that variations in the loudness of speech is reduced. For example, the loudness of the audio material could be adjusted so that the loudness of speech in all of the scenes is the same or essentially the same.

Alternatively, the loudness of the audio material can be adjusted so that the speech loudness is within a specified interval. For example, if the specified interval of speech loudness is from −24 dB to −30 dB, the levels of the audio material shown in Table III could be adjusted to the levels shown in Table IV.

TABLE IV

| Scene 1 (no change) | | Scene 2 (+7 dB) | | Scene 3 (−4 dB) | |
|---|---|---|---|---|---|
| Ship Whistle | −12 dB | | | Machine | −22 dB |
| Normal Speech | −27 dB | Whispers | −30 dB | Shouting | −24 dB |
| Distant Horn | −33 dB | Clock Tick | −36 dB | | |
| Waves | −40 dB | | | | |

In another implementation, the audio signal level is controlled so that some average of the estimated loudness is maintained at a desired level. The average may be obtained for a specified interval such as ten minutes, or for all or some specified portion of a program. Referring again to the loudness information shown in Table III, suppose the three scenes are in the same motion picture, an average loudness of speech for the entire motion picture is estimated to be at −25 dB, and the desired loudness of speech is −27 dB. Signal levels for the three scenes are controlled so that the estimated loudness for each scene is modified as shown in Table V. In this implementation, variations of speech loudness within the program or motion picture are preserved but variations with the average loudness of speech in other programs or motion pictures is reduced. In other words, variations in the loudness of speech between programs or portions of programs can be achieved without requiring dynamic range compression within those programs or portions of programs.

TABLE V

| Scene 1 (−2 dB) | | Scene 2 (−2 dB) | | Scene 3 (−2 dB) | |
|---|---|---|---|---|---|
| Ship Whistle | −14 dB | | | Machine | −20 dB |
| Normal Speech | −29 dB | Whispers | −39 dB | Shouting | −22 dB |
| Distant Horn | −35 dB | Clock Tick | −45 dB | | |
| Waves | −42 dB | | | | |

Compression of the dynamic range may also be desirable; however, this feature is optional and may be provided when desired.

C. Controlling Speech Loudness

The present invention may be carried out by a stand-alone process performed within either a transmitter or a receiver, or by cooperative processes performed jointly within a transmitter and receiver.

1. Stand-alone Process

Figure 2:
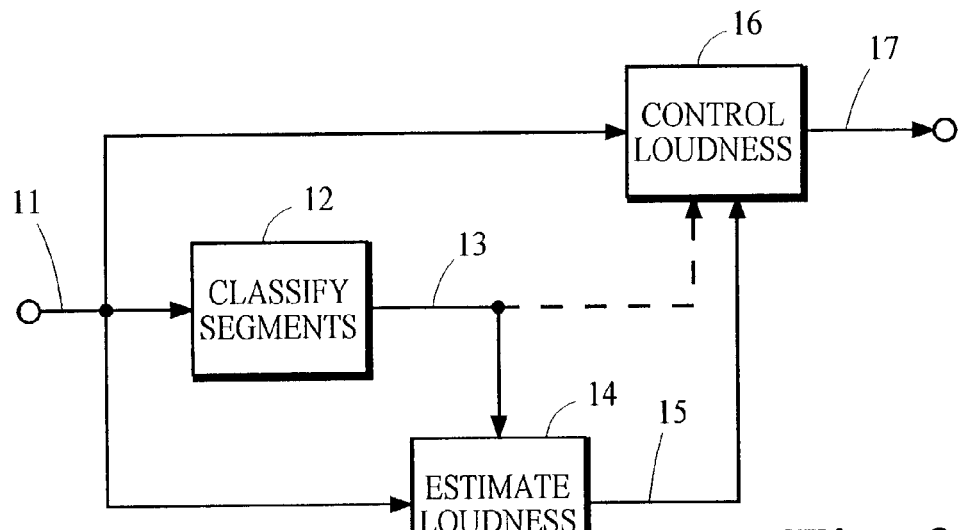
FIG. 2 is a schematic block diagram of an apparatus that may be used to control loudness of an audio signal containing speech and other types of audio material.

FIG. 2 is a schematic block diagram of an apparatus that may be used to implement a stand-alone process in a transmitter or a receiver. The apparatus receives from the path 11 audio information that represents an interval of an audio signal. The classifier 12 examines the audio information and classifies segments of the audio information as being "speech segments" that represent portions of the audio signal that are classified as speech, or as being "non-speech segments" that represent portions of the audio signal that are not classified as speech. The classifier 12 may also classify the non-speech segments into a number of classifications. Techniques that may be used to classify segments of audio information are mentioned above. A preferred technique is described below.

Each portion of the audio signal that is represented by a segment of audio information has a respective loudness. The loudness estimator 14 examines the speech segments and obtains an estimate of this loudness for the speech segments. An indication of the estimated loudness is passed along the path 15. In an alternative implementation, the loudness estimator 14 also examines at least some of the non-speech segments and obtains an estimated loudness for these segments. Some ways in which loudness may be estimated are mentioned above.

The controller 16 receives the indication of loudness from the path 15, receives the audio information from the path 11, and modifies the audio information as necessary to reduce variations in the loudness of the portions of the audio signal represented by speech segments. If the controller 16 increases the loudness of the speech segments, then it will also increase the loudness of all non-speech segments including those that are even louder than the speech segments. The modified audio information is passed along the path 17 for subsequent processing. In a transmitter, for example, the modified audio information can be encoded or otherwise prepared for transmission or storage. In a receiver, the modified audio information can be processed for presentation to a listener.

The classifier 12, the loudness estimator 14 and the controller 16 are arranged in such a manner that the estimated loudness of the speech segments is used to control the loudness of the non-speech segments as well as the speech segments. This may be done in a variety of ways. In one implementation, the loudness estimator 14 provides an estimated loudness for each speech segment. The controller 16 uses the estimated loudness to make any needed adjustments to the loudness of the speech segment for which the loudness was estimated, and it uses this same estimate to make any needed adjustments to the loudness of subsequent non-speech segments until a new estimate is received for the next speech segment. This implementation is appropriate when signal levels must be adjusted in real time for audio signals that cannot be examined in advance. In another implementation that may be more suitable when an audio signal can be examined in advance, an average loudness for the speech segments in all or a large portion of a program is estimated and that estimate is used to make any needed adjustment to the audio signal. In yet another implementation, the estimated level is adapted in response to one or more characteristics of the speech and the non-speech segments of audio information, which may be provided by the classifier 12 through the path shown by a broken line.

In a preferred implementation, the controller 16 also receives an indication of loudness or signal energy for all segments and makes adjustments in loudness only within segments having a loudness or an energy level below some threshold. Alternatively, the classifier 12 or the loudness estimator 14 can provide to the controller 16 an indication of the segments within which an adjustment to loudness may be made.

2. Cooperative Process

Figure 3:
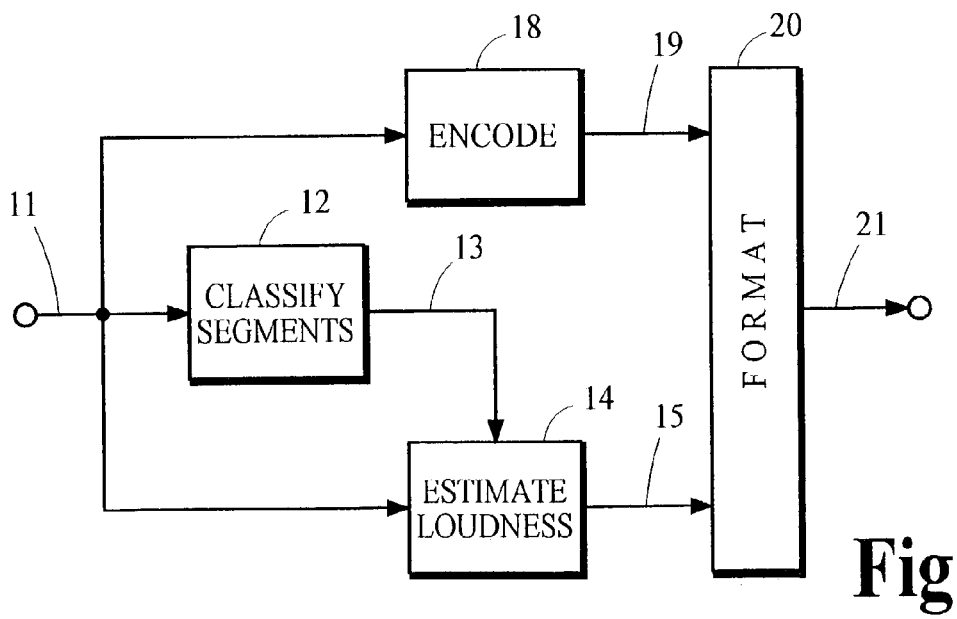
FIG. 3 is a schematic block diagram of an apparatus that may be used to generate and transmit audio information representing an audio signal and control information representing loudness of speech.

FIG. 3 is a schematic block diagram of an apparatus that may be used to implement part of a cooperative process in a transmitter. The transmitter receives from the path 11 audio information that represents an interval of an audio signal. The classifier 12 and the loudness estimator 14 operate substantially the same as that described above. An indication of the estimated loudness provided by the loudness estimator 14 is passed along path 15. In the implementation shown in the figure, the encoder 18 generates along the path 19 an encoded representation of the audio information received from the path 11. The encoder 18 may apply essentially any type of encoding that may be desired including so called perceptual coding. For example, the apparatus illustrated in FIG. 3 can be incorporated into an audio encoder to provide dialnorm information for assembly into an AC-3 compliant data stream. The encoder 18 is not essential to the present invention. In an alternative implementation that omits the encoder 18, the audio information itself is passed along path 19. The formatter 20 assembles the representation of the audio information received from the path 19 and the indication of estimated loudness received from the path 15 into an output signal, which is passed along the path 21 for transmission or storage.

In a complementary receiver that is not shown in any figure, the signal generated along path 21 is received and processed to extract the representation of the audio information and the indication of estimated loudness. The indication of estimated loudness is used to control the signal levels of an audio signal that is generated from the representation of the audio information.

3. Loudness Meter

Figure 4:
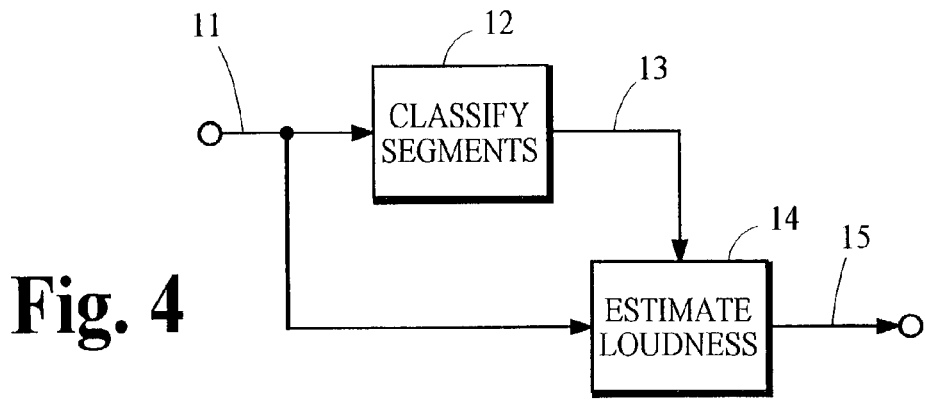
FIG. 4 is a schematic block diagram of an apparatus that may be used to provide an indication of loudness for speech in an audio signal containing speech and other types of audio material.

FIG. 4 is a schematic block diagram of an apparatus that may be used to provide an indication of speech loudness for speech in an audio signal containing speech and other types of audio material. The apparatus receives from the path 11 audio information that represents an interval of an audio signal. The classifier 12 and the loudness estimator 14 operate substantially the same as that described above. An indication of the estimated loudness provided by the loudness estimator 14 is passed along the path 15. This indication may be displayed in any desired form, or it may be provided to another device for subsequent processing.

D. Segment Classification

The present invention may use essentially any technique that can classify segments of audio information into two or more classifications including a speech classification. Several examples of suitable classification techniques are mentioned above. In a preferred implementation, segments of audio information are classified using some form of the technique that is described below.

Figure 5:
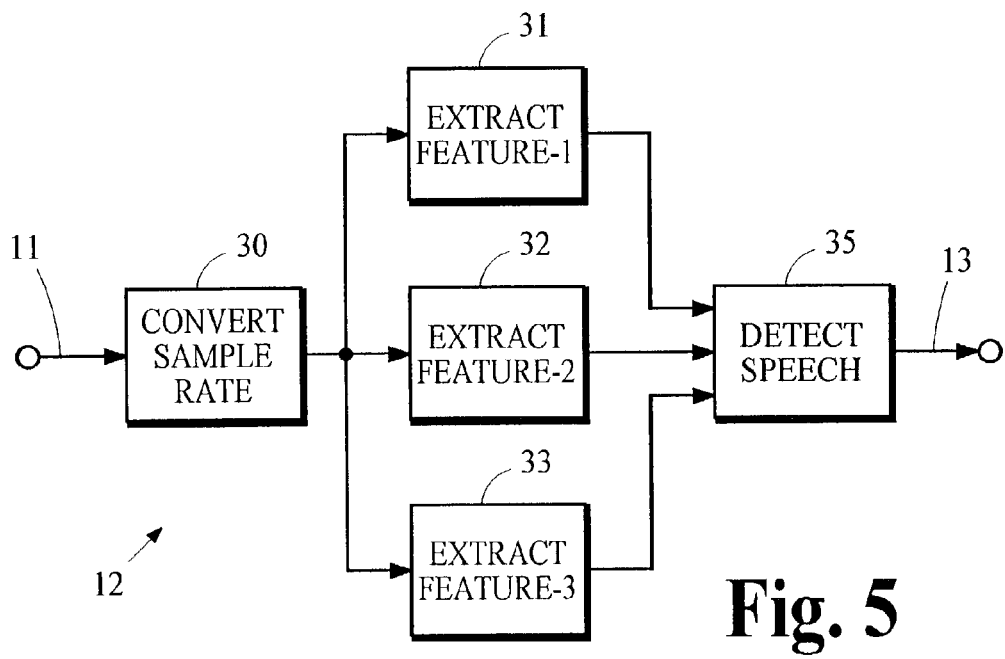
FIG. 5 is a schematic block diagram of an apparatus that may be used to classify segments of audio information.

FIG. 5 is a schematic block diagram of an apparatus that may be used to classify segments of audio information according to the preferred classification technique. The sample-rate converter receives digital samples of audio information from the path 11 and re-samples the audio information as necessary to obtain digital samples at a specified rate. In the implementation described below, the specified rate is 16 k samples per second. Sample rate conversion is not required to practice the present invention; however, it is usually desirable to convert the audio information sample rate when the input sample rate is higher than is needed to classify the audio information and a lower sample rate allows the classification process to be performed more efficiently. In addition, the implementation of the components that extract the features can usually be simplified if each component is designed to work with only one sample rate.

In the implementation shown, three features or characteristics of the audio information are extracted by extraction components 31, 32 and 33. In alternative implementations, as few as one feature or as many features that can be handled by available processing resources may be extracted. The speech detector 35 receives the extracted features and uses them to determine whether a segment of audio information should be classified as speech. Feature extraction and speech detection are discussed below.

1. Features

In the particular implementation shown in FIG. 5, components are shown that extract only three features from the audio information for illustrative convenience. In a preferred implementation, however, segment classification is based on seven features that are described below. Each extraction component extracts a feature of the audio information by performing calculations on blocks of samples arranged in frames. The block size and the number of blocks per frame that are used for each of seven specific features are shown in Table VI.

TABLE VI

| Feature | Block Size (samples) | Block Length (msec) | Blocks per Frame |
|---|---|---|---|
| Average squared $l_2$-norm of weighted spectral flux | 1024 | 64 | 32 |
| Skew of regressive line of best fit through estimated spectral power density | 512 | 32 | 64 |
| Pause count | 256 | 16 | 128 |
| Skew coefficient of zero crossing rate | 256 | 16 | 128 |
| Mean-to-median ratio of zero crossing rate | 256 | 16 | 128 |
| Short Rhythmic measure | 256 | 16 | 128 |
| Long rhythmic measure | 256 | 16 | 128 |

In this implementation, each frame is 32,768 samples or about 2.057 seconds in length. Each of the seven features that are shown in the table is described below. Throughout the following description, the number of samples in a block is denoted by the symbol N and the number of blocks per frame is denoted by the symbol M.

a) Average Squared $l_2$-norm of Weighted Spectral Flux

The average squared $l_2$-norm of the weighted spectral flux exploits the fact that speech normally has a rapidly varying spectrum. Speech signals usually have one of two forms: a tone-like signal referred to as voiced speech, or a noise-like signal referred to as unvoiced speech. A transition between these two forms causes abrupt changes in the spectrum. Furthermore, during periods of voiced speech, most speakers alter the pitch for emphasis, for lingual stylization, or because such changes are a natural part of the language. Non-speech signals like music can also have rapid spectral changes but these changes are usually less frequent. Even vocal segments of music have less frequent changes because a singer will usually sing at the same frequency for some appreciable period of time.

The first step in one process that calculates the average squared $l_2$-norm of the to a block of audio information samples and obtains the magnitude of the resulting transform coefficients. Preferably, the block of samples are weighted by a window function w[n] such as a Hamming window function prior to application of the transform. The magnitude of the DFT coefficients may be calculated as shown in the following equation.

$$|X_m[k]| = \left| \sum_{n=0}^{N-1} x[mN+n] \cdot w[n] \cdot e^{\frac{-j2\pi kn}{N}} \right| \quad \text{for } 0 \le k < \frac{N}{2} \quad (1)$$

where N=the number of samples in a block;
x[n]=sample number n in block m; and
$X_m[k]$=transform coefficient k for the samples in block m.

The next step calculates a weight W for the current block from the average power of the current and previous blocks. Using Parseval's theorem, the average power can be calculated from the transform coefficients as shown in the following equation if samples x[n] have real rather than complex or imaginary values.

$$W_m = \sum_{k=0}^{\frac{N}{2}-1} \frac{\left( |X_{m-1}[k]|^2 + |X_m[k]|^2 \right)}{N} \quad (2)$$

where $W_m$=the weight for the current block m.

The next step squares the magnitude of the difference between the spectral components of the current and previous blocks and divides the result by the block weight $W_m$ of the current block, which is calculated according to equation 2, to yield a weighted spectral flux. The $l_2$-norm or the Euclidean distance is then calculated. The weighted spectral flux and the $l_2$-norm calculations are shown in the following equation.

$$\|l_m\| = \sqrt{\sum_{k=0}^{\frac{N}{2}-1} \frac{|(X_{m-1}[k] - X_m[k])|^2}{W_m}} \quad (3)$$

where $\|l_m\|$=$l_2$-norm of the weighted spectral flux for block m.

The feature for a frame of blocks is obtained by calculating the sum of the squared $l_2$-norms for each of the blocks in the frame. This summation is shown in the following equation.

$$F_1(t) = \sum_{m=0}^{M-1} (\|l_m\|)^2 \quad (4)$$

where M=the number of blocks in a frame; and
$F_1(t)$=the feature for average squared $l_2$-norm of the weighted spectral flux for frame t.

b) Skew of Regressive Line of Best Fit through Estimated Spectral Power Density

The gradient or slope of the regressive line of best fit through the log spectral power density gives an estimate of the spectral tilt or spectral emphasis of a signal. If a signal emphasizes lower frequencies, a line that approximates the spectral shape of the signal tilts downward toward the higher frequencies and the slope of the line is negative. If a signal emphasizes higher frequencies, a line that approximates the spectral shape of the signal tilts upward toward higher frequencies and the slope of the line is positive.

Speech emphasizes lower frequencies during intervals of voiced speech and emphasizes higher frequencies during intervals of unvoiced speech. The slope of a line approximating the spectral shape of voiced speech is negative and the slope of a line approximating the spectral shape of unvoiced speech is positive. Because speech is predominantly voiced rather than unvoiced, the slope of a line that approximates the spectral shape of speech should be negative most of the time but rapidly switch between positive and negative slopes. As a result, the distribution of the slope or gradient of the line should be strongly skewed toward negative values. For music and other types of audio material the distribution of the slope is more symmetrical.

A line that approximates the spectral shape of a signal may be obtained by calculating a regressive line of best fit through the log spectral power density estimate of the signal. The spectral power density of the signal may be obtained by calculating the square of transform coefficients using a transform such as that shown above in equation 1. The calculation for spectral power density is shown in the following equation.

$$|X_m[k]|^2 = \left|\sum_{n=0}^{N-1} x[mN+n] \cdot w[n] \cdot e^{\frac{-j2\pi kn}{N}}\right|^2 \text{ for } 0 \le k < \frac{N}{2} \quad (5)$$

The power spectral density calculated in equation 5 is then converted into the log-domain as shown in the following equation.

$$X_m^{dB}[k] = 10 \cdot \log_{10}(|X_m[k]|^2) \text{ for } 0 \le k < \frac{N}{2} \quad (6)$$

The gradient of the regressive line of best fit is then calculated as shown in the following equation, which is derived from the method of least squares.

$$G_m = \frac{\frac{N}{2}\sum_{k=0}^{\frac{N}{2}-1} k X_m^{dB}[k] - \sum_{k=0}^{\frac{N}{2}-1} k \cdot \sum_{k=0}^{\frac{N}{2}-1} X_m^{dB}[k]}{\frac{N}{2}\sum_{k=0}^{\frac{N}{2}-1} k^2 - \left(\sum_{k=0}^{\frac{N}{2}-1} k\right)^2} \quad (7)$$

where $G_m$=the regressive coefficient for block m.

The feature for frame t is the estimate of the skew over the frame as given in the following equation.

$$F_2(t) = \sum_{m=0}^{M-1}\left(G_m - \sum_{m=0}^{M-1}\frac{G_m}{M^{dB}}\right)^3 \quad (8)$$

where $F_2(t)$=the feature for gradient of the regressive line of best fit through the log spectral power density for frame t.

c) Pause Count

The pause count feature exploits the fact that pauses or short intervals of signal with little or no audio power are usually present in speech but other types of audio material usually do not have such pauses.

The first step for feature extraction calculates the power P[m] of the audio information in each block m within a frame. This may be done as shown in the following equation.

$$P[m] = \sum_{n=0}^{N-1}\frac{x[n]^2}{N} \quad (9)$$

where P[m]=the calculated power in block m.

The second step calculates the power $P_F$ of the audio information within the frame. The feature for the number of pauses $F_3(t)$ within frame t is equal to the number of blocks within the frame whose respective power P[m] is less than or equal to ¼$P_F$. The value of one-quarter was derived empirically.

d) Skew Coefficient of Zero Crossing Rate

The zero crossing rate is the number of times the audio signal, which is represented by the audio information, crosses through zero in an interval of time. The zero crossing rate can be estimated from a count of the number of zero crossings in a short block of audio information samples. In the implementation described here, the blocks have a duration of 256 samples for 16 msec.

Although simple in concept, information derived from the zero crossing rate can provide a fairly reliable indication of whether speech is present in an audio signal. Voiced portions of speech have a relatively low zero crossings rate, while unvoiced portions of speech have a relatively high zero crossing rate. Furthermore because speech typically contains more voiced portions and pauses than unvoiced portions, the distribution of zero crossing rates is generally skewed toward lower rates. One feature that can provide an indication of the skew within a frame t is a skew coefficient of the zero crossing rate that can be calculated from the following equation.

$$F_4(t) = \frac{\sum_{m=0}^{M-1}\left(Z_m - \sum_{m=0}^{M-1}\frac{Z_m}{M}\right)^3}{\left(\sum_{m=0}^{M-1}\left(Z_m - \sum_{m=0}^{M-1}\frac{Z_m}{M}\right)^2\right)^{3/2}} \quad (10)$$

where $Z_m$=the zero crossing count in block m; and $F_4(t)$ = the feature for skew coefficient of the zero crossing rate for frame t.

e) Mean-to-median Ratio of Zero Crossing Rate

Another feature that can provide an indication of the distribution skew of the zero, crossing rates within a frame t is the median-to-mean ratio of the zero crossing rate. This can be obtained from the following equation.

$$F_5(t) = \frac{Z_{median}}{\sum_{m=0}^{M-1} \frac{Z_m}{M}} \quad (11)$$

where $Z_{median}$ = the median of the block zero crossing rates for all blocks in frame t; and $F_5(t)$ = the feature for median-to-mean ratio of the zero crossing rate for frame t.

f) Short Rhythmic Measure

Techniques that use the previously described features can detect speech in many types of audio material; however, these techniques will often make false detections in highly rhythmic audio material like so called "rap" and many instances of pop music. Segments of audio information can be classified as speech more reliably by detecting highly rhythmic material and either removing such material from classification or raising the confidence level required to classify the material as speech.

The short rhythmic measure may be calculated for a frame by first calculating the variance of the samples in each block as shown in the following equation.

$$\sigma_x^2[m] = \sum_{n=0}^{N-1} \frac{(x[n] - \bar{x}_m)^2}{N} \quad (12)$$

where $\sigma_x^2[m]$ = the variance of the samples x in block m; and
$\bar{x}_m$ = the mean of the samples x in block m.

A zero-mean sequence is derived from the variances for all of the blocks in the frame as shown in the following equation.

$$\delta[m] = \sigma_x^2[m] - \bar{\sigma}_x^2 \text{ for } 0 \geq m > M \quad (13)$$

where $\delta[m]$ = the element in the zero-mean sequence for block m; and
$\bar{\sigma}_x^2$ = the mean of the variances for all blocks in the frame.

The autocorrelation of the zero-mean sequence is obtained as shown in the following equation.

$$A_t[l] = \frac{1}{M} \sum_{m=0}^{M-1-l} \delta[m] \cdot \delta[m+l] \text{ for } 0 \leq l < M \quad (14)$$

where $A_t[l]$ = the autocorrelation value for frame t with a block lag of l.

The feature for the short rhythmic measure is derived from a maximum value of the autocorrelation scores. This maximum score does not include the score for a block lag l=0, so the maximum value is taken from the set of values for a block lag l≧L. The quantity L represents the period of the most rapid rhythm expected. In one implementation L is set equal to 10, which represents a minimum period of 160 msec. The feature is calculated as shown in the following equation by dividing the maximum score by the autocorrelation score for the block lag l=0.

$$F_6(t) = \frac{\max_{L \leq n < M}(A_t[n])}{A_t[0]} \quad (15)$$

where $F_6(t)$ = the feature for short rhythmic measure for frame t.

g) Long Rhythmic Measure

The long rhythmic measure is derived in a similar manner to that described above for the short rhythmic measure except the zero-mean sequence values are replaced by spectral weights. These spectral weights are calculated by first obtaining the log power spectral density as shown above in equations 5 and 6 and described in connection with the skew of the gradient of the regressive line of best fit through the log spectral power density. It may be helpful to point out that, in the implementation described here, the block length for calculating the long rhythmic measure is not equal to the block length used for the skew-of-the-gradient calculation.

The next step obtains the maximum log-domain power spectrum value for each block as shown in the following equation.

$$O_m = \max_{0 \leq k < \frac{N}{2}}(X_m^{dB}[k]) \quad (16)$$

where $O_m$ = the maximum log power spectrum value in block m.

A spectral weight for each block is determined by the number of peak log-domain power spectral values that are greater than a threshold equal to ($O_m \cdot \alpha$). This determination is expressed in the following equation.

$$W[m] = \sum_{k=0}^{\frac{N}{2}-1} \frac{\text{sign}(X_m^{dB}[k] - O_m \cdot \alpha) + 1}{2} \quad (17)$$

where W[m] = the spectral weight for block m;
sign(n) = +1 if n≧0 and −1 if n<0; and
α = an empirically derived constant equal to 0.1.

At the end of each frame, the sequence of M spectral weights from the previous frame and the sequence of M spectral weights from the current frame are concatenated to form a sequence of 2M spectral weights. An autocorrelation of this long sequence is then calculated according to the following equation.

$$AL_t[l] = \frac{1}{2M} \sum_{m=-M+1}^{M-1-l} W[m] \cdot W[m+l] \text{ for } 0 \leq l < 2M \quad (18)$$

where $AL_t[l]$ = the autocorrelation score for frame t.

The feature for the long rhythmic measure is derived from a maximum value of the autocorrelation scores. This maximum score does not include the score for a block lag l=0, so the maximum value is taken from the set of values for a block lag l≧LL. The quantity LL represents the period of the most rapid rhythm expected. In the implementation described here, LL is set equal to 10. The feature is calculated as shown in the following equation by dividing the maximum score by the autocorrelation score for the block lag l=0.

$$F_7(t) = \frac{\max_{LL \le n < M}(AL_t[n])}{AL_t[0]} \quad (19)$$

where $F_7(t)$=the feature for the long rhythmic measure for frame t.

2. Speech Detection

The speech detector 35 combines the features that are extracted for each frame to determine whether a segment of audio information should be classified as speech. One way that may be used to combine the features implements a set of simple or interim classifiers. An interim classifier calculates a binary value by comparing one of the features discussed above to a threshold. This binary value is then weighted by a coefficient. Each interim classifier makes an interim classification that is based on one feature. A particular feature may be used by more than one interim classifier. An interim classifier may be implemented by calculations performed according to the following equation.

$$C_j = c_j \cdot \text{sign}(F_i - Th_j) \quad (20)$$

where $C_j$=the binary-valued classification provided by interim classifier j;

$c_j$=a coefficient for interim classifier j;

$F_i$=feature i extracted form the audio information; and $Th_j$=a threshold for interim classifier j.

In this particular implementation, an interim classification $C_j$=1 indicates the interim classifier j tends to support a conclusion that a particular frame of audio information should be classified as speech. An interim classification $C_j$=−1 indicates the interim classifier j tends to support a conclusion that a particular frame of audio information should not be classified as speech.

The entries in Table VII show coefficient and threshold values and the appropriate feature for several interim classifiers that may be used in one implementation to classify frames of audio information.

TABLE VII

| Interim Classifier Number j | Coefficient $c_J$ | Threshold $Th_J$ | Feature Number i |
|---|---|---|---|
| 1 | 1.175688 | 5.721547 | 1 |
| 2 | −0.672672 | 0.833154 | 5 |
| 3 | 0.631083 | 5.826363 | 1 |
| 4 | −0.629152 | 0.232458 | 6 |
| 5 | 0.502359 | 1.474436 | 4 |
| 6 | −0.310641 | 0.269663 | 7 |
| 7 | 0.266078 | 5.806366 | 1 |
| 8 | −0.101095 | 0.218851 | 6 |
| 9 | 0.097274 | 1.474855 | 4 |
| 10 | 0.058117 | 5.810558 | 1 |
| 11 | −0.042538 | 0.264982 | 7 |
| 12 | 0.034076 | 5.811342 | 1 |
| 13 | −0.044324 | 0.850407 | 5 |
| 14 | −0.066890 | 5.902452 | 3 |
| 15 | −0.029350 | 0.263540 | 7 |
| 16 | 0.035183 | 5.812901 | 1 |
| 17 | 0.030141 | 1.497580 | 4 |
| 18 | −0.015365 | 0.849056 | 5 |
| 19 | 0.016036 | 5.813189 | 1 |
| 20 | −0.016559 | 0.263945 | 7 |

The final classification is based on a combination of the interim classifications. This may be done as shown in the following equation.

$$C_{final} = \text{sign}\left(\sum_{J=1}^{J} C_J\right) \quad (21)$$

where $C_{final}$=the final classification of a frame of audio information; and

J=the number of interim classifiers used to make the classification.

The reliability of the speech detector can be improved by optimizing the choice of interim classifiers, and by optimizing the coefficients and thresholds for those interim classifiers. This optimization may be carried out in a variety of ways including techniques disclosed in U.S. Pat. No. 5,819,247 cited above, and in Schapire, "A Brief Introduction to Boosting," Proc. of the 16th Int. Joint Conf. on Artificial Intelligence, 1999, which is incorporated herein by reference in its entirety.

In an alternative implementation, speech detection is not indicated by a binary-valued decision but is, instead, represented by a graduated measure of classification. The measure could represent an estimated probability of speech or a confidence level in the speech classification. This may be done in a variety of ways such as, for example, obtaining the final classification from a sum of the interim classifications rather than obtaining a binary-valued result as shown in equation 21.

3. Sample Blocks

The implementation described above extracts features from contiguous, non-overlapping blocks of fixed length. Alternatively, the classification technique may be applied to contiguous non-overlapping variable-length blocks, to overlapping blocks of fixed or variable length, or to non-contiguous blocks of fixed or varying length. For example, the block length may be adapted in response to transients, pauses or intervals of little or no audio energy so that the audio information in each block is more stationary. The frame lengths also may be adapted by varying the number of blocks per frame and/or by varying the lengths of the blocks within a frame.

E. Loudness Estimation

The loudness estimator 14 examines segments of audio information to obtain an estimated loudness for the speech segments. In one implementation, loudness is estimated for each frame that is classified as a segment of speech. The loudness may be estimated for essentially any duration that is desired.

In another implementation, the estimating process begins in response to a request to start the process and it continues until a request to stop the process is received. In the receiver 4, for example, these requests may be conveyed by special codes in the signal received from the path 3. Alternatively, these requests may be provided by operation of a switch or other control provided on the apparatus that is used to estimate loudness. An additional control may be provided that causes the loudness estimator 14 to suspend processing and hold the current estimate.

In one implementation, loudness is estimated for all segments of audio information that are classified as speech. In principle, however, loudness could be estimated for only selected speech segments such as, for example, only those segments having a level of audio energy greater than a threshold. A similar effect also could be obtained by having the classifier 12 classify the low-energy segments as non-speech and then estimate loudness for all speech segments. Other variations are possible. For example, older segments can be given less weight in estimated loudness calculations.

In yet another alternative, the loudness estimator 14 estimates loudness for at least some of the non-speech segments. The estimated loudness for non-speech segments may be used in calculations of loudness for an interval of audio information; however, these calculations should be more responsive to estimates for the speech segments. The estimates for non-speech segments may also be used in implementations that provide a graduated measure of classification for the segments. The calculations of loudness for an interval of the audio information can be responsive to the estimated loudness for speech and non-speech segments in a manner that accounts for the graduated measure of classification. For example, the graduated measure may represent an indication of confidence that a segment of audio information contains speech. The loudness estimates can be made more responsive to segments with a higher level of confidence by giving these segments more weight in estimated loudness calculations.

Loudness may be estimated in a variety of ways including those discussed above. No particular estimation technique is critical to the present invention; however, it is believed that simpler techniques that require fewer computational resources will usually be preferred in practical implementations.

F. Implementation

Figure 6:
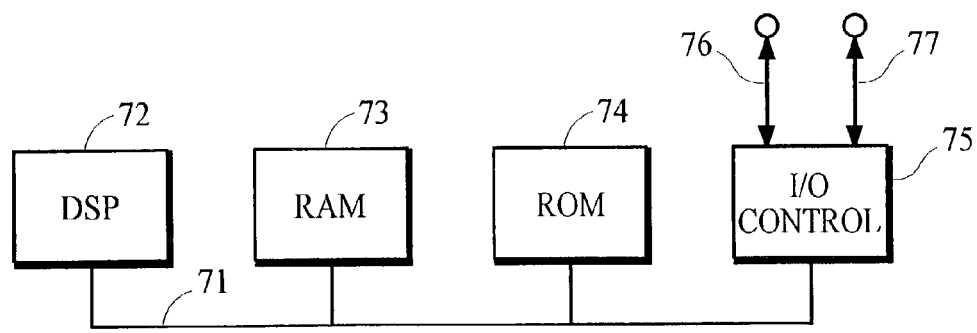
FIG. 6 is a schematic block diagram of an apparatus that may be used to implement various aspects of the present invention.

Various aspects of the present invention may be implemented in a wide variety of ways including software in a general-purpose computer system or in some other apparatus that includes more specialized components such as digital signal processor computer system. FIG. 6 is a block diagram of device 70 that may be used to implement various aspects of the present invention in an audio encoding transmitter or an audio memory (RAM) used by DSP 72 for signal processing. ROM 74 represents some form of persistent storage such as read only memory (ROM) for storing programs needed to operate device 70. I/O control 75 represents interface circuitry to receive and transmit signals by way of communication channels 76, 77. Analog-to-digital converters and digital-to-analog converters may be included in I/O control 75 as desired to receive and/or transmit analog audio signals. In the embodiment shown, all major system components connect to bus 71, which may represent more than one physical bus; however, a bus architecture is not required to implement the present invention.

In embodiments implemented in a general purpose computer system, additional components may be included for interfacing to devices such as a keyboard or mouse and a display, and for controlling a storage device having a storage medium such as magnetic tape or disk, or an optical medium. The storage medium may be used to record programs of instructions for operating systems, utilities and applications, and may include embodiments of programs that implement various aspects of the present invention.

The functions required to practice the present invention can also be performed by special purpose components that are implemented in a wide variety of ways including discrete logic components, one or more ASICs and/or program-controlled processors. The manner in which these components are implemented is not important to the present invention.

Software implementations of the present invention may be conveyed by a variety machine readable media such as baseband or modulated communication paths throughout the spectrum including from supersonic to ultraviolet frequencies, or storage media including those that convey information using essentially any magnetic or optical recording technology including magnetic tape, magnetic disk, and optical disc. Various aspects can also be implemented in various components of computer system 70 by processing circuitry such as ASICs, general-purpose integrated circuits, microprocessors controlled by programs embodied in various forms of ROM or RAM, and other techniques.

The invention claimed is:

1. A method for signal processing that comprises:
   receiving an audio signal;
   extracting features of the audio signal;
   analyzing one or more of the extracted features to perform a speech determination;
   classifying segments within an interval of the audio signal as speech segments or non-speech segments based upon the speech determination, wherein each segment has a respective loudness, and the loudness or the speech segments is less than the loudness of one or more loud non-speech segments;
   analyzing one or more of the extracted features of the audio signal to obtain an estimated loudness of the speech segments; and
   providing an indication of the loudness of the interval of the audio signal by calculating control information from a weighted combination of the estimated loudness of the speech segments and the loudness of the non-speech segments in which the estimated loudness of the speech segments is weighted more heavily.

2. The method according to claim 1 that comprises:
   controlling the loudness of the interval of the audio signal in response to the control information so as to reduce variations in the loudness of the speech segments, wherein the loudness of the portions of the audio signal represented by the one or more loud non-speech segments is increased when the loudness of the portions of the audio signal represented by the speech-segments is increased.

3. The method according to claim 1 that comprises:
   assembling a representation of the audio signal and the control information into an output signal and transmitting the output signal.

4. A computer-readable storage medium storing instructions for instructing processing circuitry to perform any one of the methods of claim 1 through 3.

5. An apparatus for signal processing that comprises:
   an input terminal that receives an input signal;
   memory; and
   processing circuitry coupled to the input terminal and the memory; wherein the processing circuitry performs any one of the methods of claims 1 through 3.

6. The method according to claim 1 or 2 that obtains the estimated loudness of the speech segments by calculating average power of a frequency-weighted version of the audio signal represented by the speech segments.

7. The method according to claim 1 or 2 that obtains the estimated loudness of the speech segments by applying a psychoacoustic model of loudness to the audio information.

8. The method according to claim 1 or 2 that classifies segments by deriving from the extracted features a plurality of characteristics of the audio signal, weighting each characteristic by a respective measure of importance, and classifying the segments according to a combination of the weighted characteristics.

9. The method according to claim 1 or 2 that controls the loudness of the interval of the audio signal by adjusting the loudness only during intervals of the audio signal having a measure of audio energy less than a threshold.

10. The method according to claim 1 or 2 wherein
the weighting of the loudness of the non-speech segments in the weighted combination is zero.

11. The method according to claim 1 or 2 that comprises
analyzing one or more of the extracted features of the audio signal to obtain an estimate of the loudness of one or more non-speech segments.

12. The method according to claim 1 or 2 that comprises:
providing a speech measure that indicates a degree to which the audio signal represented by a respective segment has characteristics of speech; and
providing the indication of loudness by calculating the control information in response to the estimated loudness of respective segments according to the speech measures of the respective segments.

13. The method according to claim 1 or 2 that comprises
calculating the control information in response to the estimated loudness of respective segments according to time order of the segments.

14. The method according to claim 1 or 2 that comprises
adapting lengths of the segments in response to characteristics of the audio signal.

15. A computer-readable storage medium storing instructions for instructing processing circuitry to perform the method of claim 6.

16. A computer-readable storage medium storing instructions for instructing processing circuitry to perform the method of claim 7.

17. A computer-readable storage medium storing instructions for instructing processing circuitry to perform the method of claim 8.

18. A computer-readable storage medium storing instructions for instructing processing circuitry to perform the method of claim 9.

19. A computer-readable storage medium storing instructions for instructing processing circuitry to perform the method of claim 10.

20. A computer-readable storage medium storing instructions for instructing processing circuitry to perform the method of claim 11.

21. A computer-readable storage medium storing instructions for instructing processing circuitry to perform the method of claim 12.

22. A computer-readable storage medium storing instructions for instructing processing circuitry to perform the method of claim 13.

23. A computer-readable storage medium storing instructions for instructing processing circuitry to perform the method of claim 14.

24. An apparatus for signal processing that comprises:
an input terminal that receives an input signal;
memory; and
processing circuitry coupled to the input terminal and the memory; wherein the processing circuitry performs the method of claim 6.

25. An apparatus for signal processing that comprises:
an input terminal that receives an input signal;
memory; and
processing circuitry coupled to the input terminal and the memory; wherein the processing circuitry performs the method of claim 7.

26. An apparatus for signal processing that comprises:
an input terminal that receives an input signal;
memory; and
processing circuitry coupled to the input terminal and the memory; wherein the processing circuitry performs the method of claim 8.

27. An apparatus for signal processing that comprises:
an input terminal that receives an input signal;
memory; and
processing circuitry coupled to the input terminal and the memory; wherein the processing circuitry performs the method of claim 9.

28. An apparatus for signal processing that comprises:
an input terminal that receives an input signal;
memory; and
processing circuitry coupled to the input terminal and the memory; wherein the processing circuitry performs the method of claim 10.

29. An apparatus for signal processing that comprises:
an input terminal that receives an input signal;
memory; and
processing circuitry coupled to the input terminal and the memory; wherein the processing circuitry performs the method of claim 11.

30. An apparatus for signal processing that comprises:
an input terminal that receives an input signal;
memory; and
processing circuitry coupled to the input terminal and the memory; wherein the processing circuitry performs the method of claim 12.

31. An apparatus for signal processing that comprises:
an input terminal that receives an input signal;
memory; and
processing circuitry coupled to the input terminal and the memory; wherein the processing circuitry performs the method of claim 13.

32. An apparatus for signal processing that comprises:
an input terminal that receives an input signal;
memory; and
processing circuitry coupled to the input terminal and the memory; wherein the processing circuitry performs the method of claim 14.

33. A method for signal processing that comprises:
receiving an input audio signal;
extracting features of the input audio signal, the extracted features representing an interval of the input of audio signal;
analyzing the extracted features to perform a speech determination;
classifying the interval of the audio signal as speech or non-speech based upon the speech determination, wherein each interval has a respective loudness and the loudness of the interval classified as speech is less than the loudness of one or more other segments classified as non-speech;

analyzing the extracted features of the interval classified as speech to obtain an estimated loudness of the interval classified as speech;

calculating a loudness control parameter, the loudness control parameter being proportional to the difference between the estimated loudness of intervals classified as speech; and adjusting an estimated loudness of intervals classified as non-speech, the adjustment being proportional to the calculated loudness control parameter.

34. A computer-readable storage medium storing instructions for instructing processing circuitry to perform the method of claim 33.

35. An apparatus for signal processing that comprises:
an input terminal that receives an input signal;
memory; and
processing circuitry coupled to the input terminal and the memory; wherein the processing circuitry performs the method of claim 33.

* * * * *

UNITED STATES PATENT AND TRADEMARK OFFICE
CERTIFICATE OF CORRECTION

PATENT NO. : 7,454,331 B2
APPLICATION NO. : 10/233073
DATED : November 18, 2008
INVENTOR(S) : Mark Stuart Vinton et al.

It is certified that error appears in the above-identified patent and that said Letters Patent is hereby corrected as shown below:

Column 18, line 32, "loudness or the speech" should be --loudness of the speech--.

Column 19, line 5, "audio information" should be --audio signal--.

Column 20, line 66, "segments" should be --intervals--.

Signed and Sealed this

Twenty-fourth Day of November, 2009

David J. Kappos
*Director of the United States Patent and Trademark Office*